United States Patent [19]

Theuwissen

[11] Patent Number: 4,723,168
[45] Date of Patent: Feb. 2, 1988

[54] CHARGE-COUPLED DEVICE AND CAMERA COMPRISING SUCH A CHARGE-COUPLED DEVICE

[75] Inventor: Albert J. P. Theuwissen, Eindhoven, Netherlands

[73] Assignee: U.S. Philips Corporation, New York, N.Y.

[21] Appl. No.: 856,568

[22] Filed: Apr. 21, 1986

[30] Foreign Application Priority Data

Apr. 29, 1985 [NL] Netherlands ...................... 8501210

[51] Int. Cl.⁴ .............................................. H04N 3/15
[52] U.S. Cl. ........................... 358/213.31; 358/213.26
[58] Field of Search .............. 358/213, 213.22, 213.26, 358/213.28, 213.31; 307/24; 357/24 LR

[56] References Cited

U.S. PATENT DOCUMENTS 4,574,313  3/1986  Battson ........................... 358/213.26
4,575,763  3/1986  Elabd ............................. 358/213.26
4,580,169  4/1986  Savoye .......................... 358/213.26

OTHER PUBLICATIONS

Theuwissen, A. J. P., et al., "The Accordion Imager: an Ultra High Density Frame Transfer CCD", *International Electron Devices Meeting Technical Digest*, pp. 40–43, (Dec. 1984).

*Primary Examiner*—Jin F. Ng
*Assistant Examiner*—Stephen Brinich
*Attorney, Agent, or Firm*—Marc D. Schechter

[57] ABSTRACT

The invention relates to a charge-coupled device, more particularly a sensor operated by the so-called accordion principle, in which the charge packets are stored with a very high density. In order to prevent signal mixing, charge pockets are transported with a lower density. The logic circuits required for driving the sensor are integrated in the chip itself.

15 Claims, 10 Drawing Figures

CHARGE-COUPLED DEVICE AND CAMERA COMPRISING SUCH A CHARGE-COUPLED DEVICE

BACKGROUND OF THE INVENTION

The invention relates to a charge-coupled device comprising:

a. a semiconductor body having a charge transport channel defined at the surface for storing and stepwise transferring information in the form of discrete charge packets;

b. a row of clock electrodes above the charge transport channel for inducing a pattern of alternating potential wells and potential barriers in the charge transport channel;

c. first means for applying voltages to the clock electrodes, these means being such that during the storage of charge packets the charge-coupled device is operated as an m-phase device and during the transfer of charge packets is operated as an n-phase device, m and n both being natural numbers and m being larger than or equal to 1 and n being larger than m.

The invention further relates to a camera provided with such a device.

Such a charge-coupled device is distinguished from the conventional charge-coupled devices in that the information is stored with a higher density in the channel than it is transported therein. As will appear hereinafter, this property is of importance more particularly, though not exclusively, for image sensors.

In image sensors of, for example, the frame transfer type, in which the CCD acts as a sensor, as a transport channel and as a memory, it is usual, for example, in the case of 4-phase transport to operate the sensor action also as a 4-phase system. A photosensitive element or pixel then corresponds to four electrodes. In the storage section, one storage site also corresponds to four electrodes.

However, when the device is operated in the manner described above, it is possible while maintaining the electrode configuration, to store a charge packet in every second electrode. In comparison with a conventional 4-phase CCD, this means for the photo-sensitive section a doubling of the number of pixels per unit surface area.

In order to avoid that during transport charge packets are combined due to the high density, the frame of the charge packets is extended by first shifting only the charge packet closest to the output over a certain distance, and by then shifting this packet and simultaneously the next packet etc., in which event each time the distances between successive charge packets are made sufficiently large for the normal 4-phase transport. The inverse is the case in the storage section, in which the frame is compressed again, as a result of which the charge packets are stored again in every second electrode. Because of the resemblance to the extraction and compression of the bellows of an accordion, this device is designated as the "accordion sensor" in the lecture entitled "The Accordion Imager: an Ultra High Density Frame Transfer CCD" by A. J. P. Theuwissen et al (*International Electron Devices Meeting Technical Digest*, San Francisco, 1984, pages 40–43).

Besides clock voltage generators, a charge-coupled image sensor also comprises electronic control means indicating how and when the device is expected to operate. These electronic means indicate by way of example when an integration period begins and ends, when a frame of the photosensitive section has to be shifted into the storage section, when the frame has been shifted completely into the storage section, and so on. These electronic means essentially comprise a number of counters which count the pulses of a clock and give up a signal after a given number of pulses, as a result of which the device can pass from one condition to another.

An additional complication may then occur due to the "interlacing" mode of operation, in which the pixels in two successive frames are relatively shifted by a half vertical pitch. In this mode of operation, the numbers of clock pulses required for the transport of the two frames are generally not equal to each other. Due to their complexity, these electronic control means are mostly arranged externally, that is to say outside the chip of the sensor itself.

SUMMARY OF THE INVENTION

It is an object of the invention inter alia to considerably simplify these electronic control means for CCD's of the accordion type described above and/or to shape them into such a form that, if desired, they may be integrated at least in part with the charge-coupled device.

The invention is based inter alia on the recognition of the fact that in a CCD of the accordion type the potential distribution over the clock electrodes at a given instant t (or a parameter corresponding unambiguously to this potential distribution) is indicative of the condition of the charge-coupled device. The invention is further based on the recognition of the fact that by detection of the potential distribution it is possible to determine the instant t at which a next operation has to be started.

A charge-coupled device according to the invention is characterized in that second means are provided by which the condition of the charge-coupled device can be detected and, depending upon this condition, an adjustment signal can be generated, which is used as a control signal for causing the charge-coupled device to pass to a next condition.

As will appear from the description of the Figures, a large part of the electronic control means can be reduced to a few tens of logic gates. These gates can moreover be readily combined with the sensor itself to form a common integrated circuit.

BRIEF DESCRIPTION OF THE DRAWING

The invention will be described more fully with reference to an embodiment and the accompanying diagrammatic drawing, in which.

DESCRIPTION OF THE PREFERRED EMBODIMENTS

Figure 1:
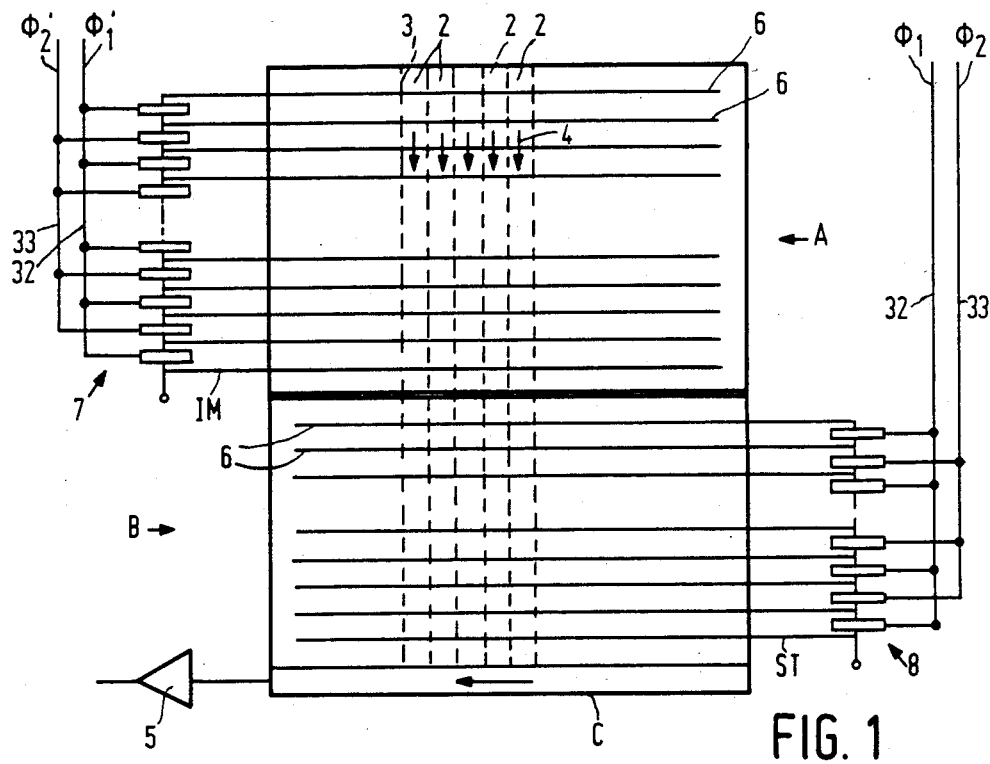
FIG. 1 is a diagrammatic plan view of an image sensor of the accordion type.

FIG. 1 shows a diagrammatic plan view of an accordion CCD sensor of the FT type, as described inter alia in the aforementioned publication of Theuwissen et al. The arrangement comprises a large number of vertically arranged charge-coupled devices 2, of which only five are shown in FIG. 1. The lateral boundaries 3 of the CCD's are indicated by broken lines. The arrows 4 in the channels 2 indicate the charge transport direction.

As usual, the array of charge-coupled devices 2 is subdivided into two sections, i.e. the A section, by means of which a projected radiation image is converted into a pattern of charge packets, and a B-section, which forms a memory in which the pattern generated in A can be stored for reading. The matrix is read by means of the horizontal C register, in which each time one line of the matrix can be transported in the usual charge-coupled manner to the left and can be read one by one at the output of the detector 5.

As usual, the arrangement further comprises a system of clock electrodes which for the sake of simplicity are indicated by lines 6 in the diagrammatic plan view of FIG. 1. The clock voltages required for the charge transport are applied by means of the shift register 7 for the A section and the shift registers 8 for the B section. These shift registers will be described more fully hereinafter. The C register is assumed to be operated in a usual 2-, 3- or 4-phase manner, which will not be described further.

Figure 2:
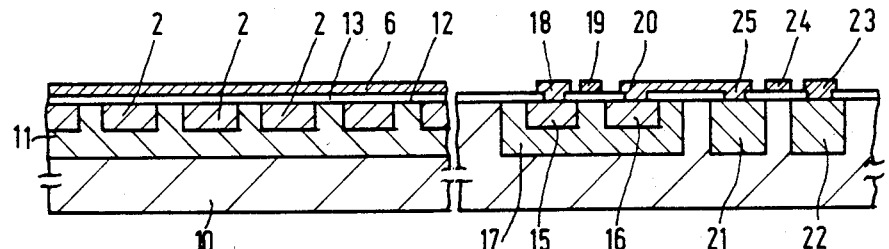
FIG. 2 is a sectional view of the arrangement shown in FIG. 1.

The lefthand part of FIG. 2 is a sectional view transverse to the charge transport direction of a section comprising five charge-coupled devices 2. The arrangement is manufactured by way of example in an n-type silicon body 10 having a p-type surface region 11 (p--well) adjoining the surface 12. The p-type layer or zone 11 is provided with the channels of the charge-coupled devices 2 in the form of n-type surface zones, which for the sake of simplicity are also designated here by reference numeral 2. The thickness and the doping concentration of the channels 2 are chosen so that the storage and transport of charge can take place in the form of electrons in the bulk of the zones 2 (BCCD or PCCD).

The electrodes 6 are insulated by a thin dielectric layer 13 of, for example, silicon oxide from the surface 12. The electrodes 6 can be provided in the usual manner, for example, in a three-layer polycrystalline silicon technology. Of course, instead of a p-type region 11 in the form of a surface region (p-well) a substrate 10 wholly consisting of p-type silicon may also be used. However, the use of an n-type body 10 and the p-type surface region 11 affords given known advantages in connection with the absorption of long-wave light (red and infrared light). The charge carriers which are generated due to the large penetration depth of this light at a large distance from the surface can be drained via the substrate 10 without being distributed over the photosensitive region and thus causing blurring of the image.

The use of the p-well 11 moreover has the advantage that for the peripheral electronic system required for controlling the sensor use can be made of a C-MOS technology, as shown diagrammatically in the righthand part of FIG. 2. By way of example, this part of the drawing shows a C-MOS inverter stage or inverter circuit comprising an n-channel MOS transistor and a p-channel MOS transistor. The n-channel MOS transistor comprises n-type source and drain zones 15 and 16, respectively, provided in the p-well 17, which can be manufactured simultaneously with the p-well 11. The transistor further comprises a source contact 18, a gate electrode 19 and a drain contact 20 which is connected to the drain 21 of the p-channel MOS transistor. The p-channel transistor comprises source and drain zones 22 and 21, respectively, in the form of p-type zones which, if desired, may also be manufactured simultaneously with the p-well 11. The transistor further comprises a source contact 23, a gate electrode 24 and a drain contact 25, which is connected to the drain contact 20 of the n-channel transistor.

Figure 3:
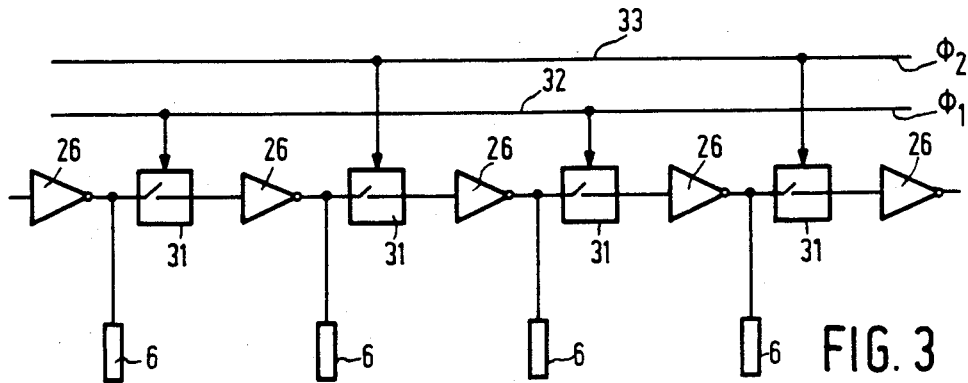
FIG. 3 shows a circuit diagram of the shift registers used in this arrangement.

FIG. 3 shows by way of example a possible embodiment of the shift registers 7, 8. The shift registers are essentially composed of a chain of inverter circuits 26, whose outputs are connected to the clock electrodes 6. The inverter circuits may be of the C-MOS type described above with reference to FIG. 2 and may comprise an n-channel transistor 27 and a p-channel transistor 28, as shown diagrammatically in FIG. 4.

The gates of the transistors 27 and 28 are interconnected. The input signal can be supplied via the junction 29. The output 30 is connected to a clock electrode 6. The inverter circuits 26 are interconnected through switches 31, which can be opened and closed via the clock voltages $\phi_1$ and $\phi_2$ supplied via the conductors 32, 33.

Figure 4:
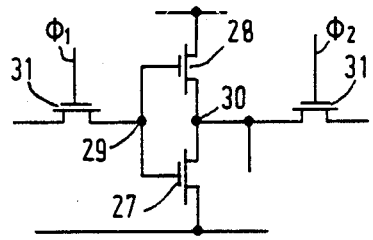
FIG. 4 shows a circuit diagram of one stage of such a shift register.

As shown in FIG. 4, these switches can simply comprise a MOS transistor, in the present case an n-channel MOS transistor. However, it will be appreciated that p-channel MOS transistors or other types or combinations of known switches may also be used.

For a detailed description of other embodiments of the shift registers 7, 8 and for a more detailed description of the operation of the arrangement than is given here, reference may be made to the earlier non-prepublished Netherlands Patent Application No. 84 01311 (PHN 10 997) in the name of Applicant. In the present Application, the principle of the accordion sensor will be explained briefly with reference to FIGS. 5 and 6 only as far as this is of importance for a clear understanding of the invention.

Figure 5A:
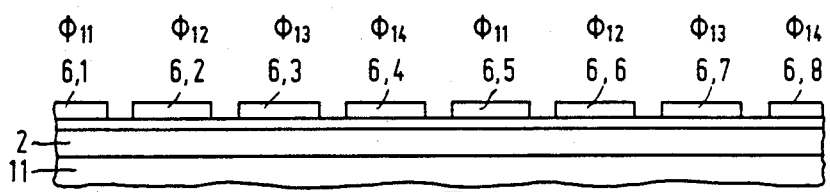
FIGS. 5A and 5B show potential distributions in an accordion sensor during the transport at different instants t.

FIG. 5a shows in sectional view a part of a charge-coupled device in the photosensitive section comprising a number of clock electrodes which, in order to distinguish them from each other, are provided with reference numerals 6,1; 6,2; 6,3; 6,4; etc. The voltages applied to the clock electrodes 6 vary between a high level—at which a potential well is induced in the underlying part of the channel 2—and a low level—at which a potential barrier is induced in the associated part of the channel.

By way of example, the charge transport is a 4-phase transport under the influence of the 4-phase clock voltages $\phi_{11}$, $\phi_{12}$, $\phi_{13}$ and $\phi_{14}$.

Figure 5B:

FIG. 5b shows the potential distribution in the channel 2 at a number of instants t. In the drawing, the positive potential is plotted in downward direction. First (instant $t_o$) the situation is shown occurring in the integration period, in which the arrangement is operated as a 2-phase system by applying a high voltage to the electrodes 6,1; 6,3; 6,5; 6,7 etc. and by applying a low voltage to the electrodes 6,2; 6,4; 6,6 etc. Thus, in every second electrode a potential well is induced in which a charge packet can be stored. Each pixel consequently corresponds to a region equal to the size of two electrodes, which implies a doubling of the pixel density as compared with conventional 4-phase systems. The size of the charge packets 35–38 corresponds, as is known to the intensity of the incident radiation.

Since the pixel density is too high for the conventional 4-phase transport, the clock voltages $\phi_{11}$–$\phi_{14}$ are not applied, as usual, to all electrodes at a time, but are applied gradually thereto, as shown in FIG. 5b for the instants $t_1$–$t_8$. At $t_1$, $\phi_{14}$ is applied to the electrode 6, 8, as a result of which below the electrode 6,8 the potential barrier is replaced by a well. At $t_2$, $\phi_{13}$ is applied to the electrode 6,7 as a result of which the well below the electrode 6,7 is replaced by a potential barrier and the charge packet 35 has shifted one position to the right. The charge packets 36, 37 and 38 have not changed their place in this period.

The distance between the charge packets 35 and 36 is now ($t_2$) sufficiently large to also cause the charge packet 36 to participate in the charge transport without the risk of the packets being mixed. In the period $t_3$, $t_4$, besides the charge packet 35 at the same time the charge packet 36 is shifted by one position, while the charge packets 37 and 38 remain in place. At $t_4$, the distance between the packets 36 and 37 is also sufficiently large so that the packet 37 can also be transported to the right in the usual 4-phase manner simultaneously with the preceding packets 35, 36 ($t_5$, $t_6$). At $t_6$, the distance between the packets 37 and 38 is sufficiently large for a 4-phase transport so that the packet 38 can also be transported.

Summarizing, it can therefore be said that on behalf of the charge transport from the A section to the B section first the distances between the charge packets are enlarged, whereupon these charge packets are transported further in the usual manner (extraction of the accordion).

Figure 6A:
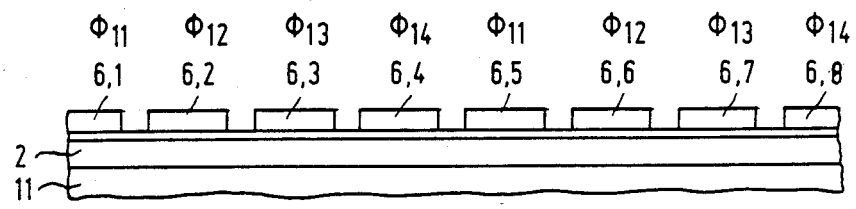
FIGS. 6A and 6B show potential distributions in an accordion CCD during the storage of the charge packets at a number of instants t.
Figure 6B:
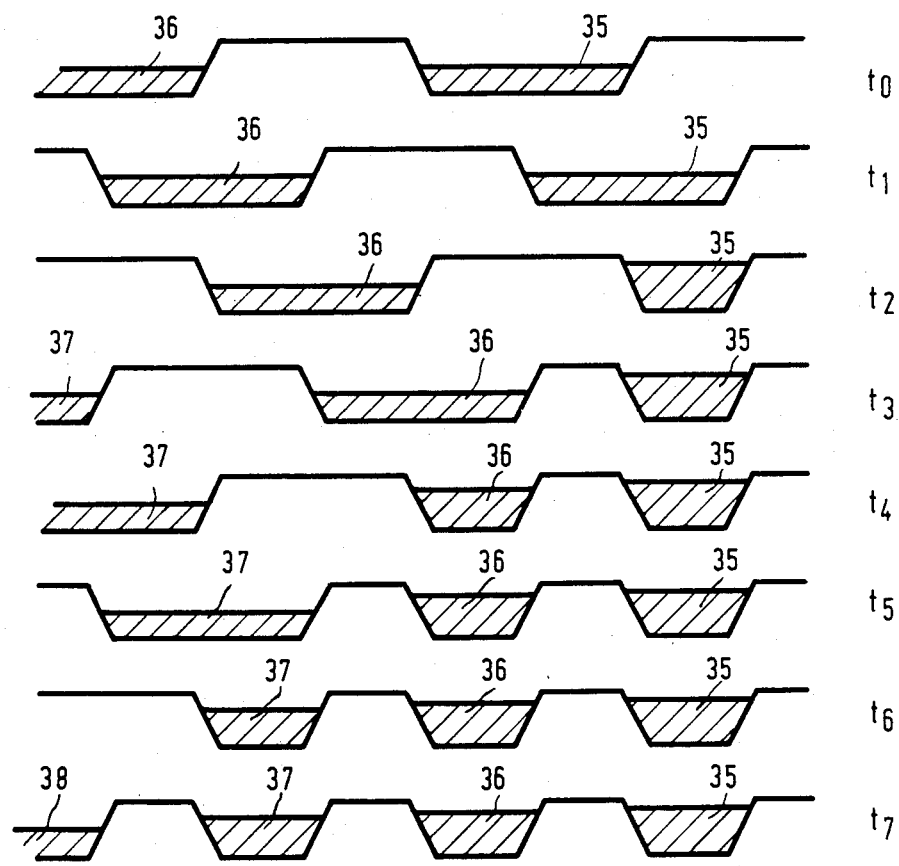

The inverse situation (compression of the accordion) occurs during the storage of the charge packets in the storage section, in which event the charge packets arriving in a 4-phase transport manner are stored in a 2-phase manner. In order to illustrate this, FIG. 6a shows in the same manner as FIG. 5a a part of the charge-coupled device in the storage section or B section, while FIG. 6b shows in the same manner as FIG. 5b the associated potential distributions at a number of instants.

The first two Figures ($t_0$, $t_1$) illustrate the situation in which the device is operated as a 4-phase CCD with four clock voltages $\phi_{11}$–$\phi_{14}$. As appears from the drawing, the two charge packets 35 and 36 correspond to eight clock electrodes 6. When ($t_1$) the charge packet 35 has arrived below the clock electrode 6,7, the voltage at this clock electrode does not change any more and neither does the voltage at the clock electrode 6,8, below which a barrier has formed. At $t_2$, the voltage at the clock electrode 6,6 decreases so that a barrier is also formed below this clock electrode. The voltage at this clock electrode further also remains constant so that the charge packet does not change its place any more. In an analogous manner, the charge packet 36 is stored ($t_3$, $t_4$) when it has arrived below the clock electrode 6,5 in a potential well bounded on both sides by potential barriers below the clock electrodes 6,6 and 6,4. In the next cycle ($t_5$, $t_6$), the charge packet 37 is stored below the clock electrode 6,3; subsequently ($t_7$) the charge packet 38 is stored below the clock electrode 6,1. As appears from the Figures at $t_7$, the eight clock electrodes 6,1–6,8 correspond to four charge packets, which means that the information density during the storage in the storage section is twice the information density during the charge transport.

Table 1 and Table 2 indicate how the logic state of the clock electrodes changes when an image sensed in the A section is transferred to the storage section and when the A section is then again made ready for sensing a next image. Table 1 indicates the situation for the even field and Table 2 indicates the situation for the odd field. The clock electrodes of the storage section are denoted by ST, $A_s$, $B_s$, $C_s$ etc., ST representing the clock electrode located closest to the horizontal reading register C and controlled directly by the input signal of the shift register 8. It is assumed that together with the clock electrode ST the storage section comprises eight clock electrodes.

The symbol H represents the output of an additional stage of the shift register 8, which is no longer connected to a clock electrode of the storage section and with which, as will appear below, given advantages can be obtained.

In the photo-sensitive section, the first electrode is designated by IM. The following electrodes are designated by $A_i$ ... $I_i$, the suffix i indicating that electrodes of the photo-sensitive section (image section) are concerned. It should be noted that the latter section comprises a number of electrodes exceeding by two the number of electrodes in the storage section. This difference is firstly due to the fact that the charge packets below IM often cannot be used for the image display because the geometric conditions for IM are not the same as for the remaining lines. When charge is integrated below the electrode IM, this line can be directly drained via the C register when the charge pattern is shifted from the A section to the B section.

TABLE 1

|    | ST | $A_s$ | $B_s$ | $C_s$ | $D_s$ | $E_s$ | $F_s$ | $G_s$ | H | IM | $A_i$ | $B_i$ | $C_i$ | $D_i$ | $E_i$ | $F_i$ | $G_i$ | $H_i$ | $I_i$ |
|----|----|----|----|----|----|----|----|----|---|----|----|----|----|----|----|----|----|----|----|
| $t_1$ | 0 | 0 | 1 | 1 | 0 | 0 | 1 | 1 | 0 | 1 | 0 | 1 | 0 | 1 | 0 | 1 | 0 | 1 | 0 |
| $t_2$ | 0 | 1 | 1 | 0 | 0 | 1 | 1 | 0 | 0 | 1 | 0 | 1 | 0 | 1 | 0 | 1 | 0 | 1 | 0 |
| $t_3$ | 1 | 1 | 0 | 0 | 1 | 1 | 0 | 0 | 1 | 1 | 0 | 1 | 0 | 1 | 0 | 1 | 0 | 1 | 0 |
| $t_4$ | 1 | 0 | 0 | 1 | 1 | 0 | 0 | 1 | 1 | 1 | 0 | 1 | 0 | 1 | 0 | 1 | 0 | 1 | 0 |

TABLE 1-continued

| | ST | $A_s$ | $B_s$ | $C_s$ | $D_s$ | $E_s$ | $F_s$ | $G_s$ | H | IM | $A_i$ | $B_i$ | $C_i$ | $D_i$ | $E_i$ | $F_i$ | $G_i$ | $H_i$ | $I_i$ |
|---|---|---|---|---|---|---|---|---|---|---|---|---|---|---|---|---|---|---|---|
| $t_5$ | 0 | 0 | 1 | 1 | 0 | 0 | 1 | 1 | 0 | 0 | 0 | 1 | 0 | 1 | 0 | 1 | 0 | 1 | 0 |
| $t_6$ | 0 | 1 | 1 | 0 | 0 | 1 | 1 | 0 | 0 | 0 | 1 | 1 | 0 | 1 | 0 | 1 | 0 | 1 | 0 |
| $t_7$ | 1 | 1 | 0 | 0 | 1 | 1 | 0 | 0 | 1 | 1 | 1 | 0 | 0 | 1 | 0 | 1 | 0 | 1 | 0 |
| $t_8$ | 1 | 0 | 0 | 1 | 1 | 0 | 0 | 1 | 1 | 1 | 0 | 0 | 1 | 1 | 0 | 1 | 0 | 1 | 0 |
| $t_9$ | 0 | 0 | 1 | 1 | 0 | 0 | 1 | 1 | 0 | 0 | 0 | 1 | 1 | 0 | 0 | 1 | 0 | 1 | 0 |
| $t_{10}$ | 0 | 1 | 1 | 0 | 0 | 1 | 1 | 0 | 0 | 0 | 1 | 1 | 0 | 0 | 1 | 1 | 0 | 1 | 0 |
| $t_{11}$ | 1 | 1 | 0 | 0 | 1 | 1 | 0 | 0 | 1 | 1 | 1 | 0 | 0 | 1 | 1 | 0 | 0 | 1 | 0 |
| $t_{12}$ | 1 | 0 | 0 | 1 | 1 | 0 | 0 | 1 | 1 | 1 | 0 | 0 | 1 | 1 | 0 | 0 | 1 | 1 | 0 |
| $t_{13}$ | 0 | 0 | 1 | 1 | 0 | 0 | 1 | 1 | 0 | 0 | 0 | 1 | 1 | 0 | 0 | 1 | 1 | 0 | 0 |
| $t_{14}$ | 0 | 1 | 1 | 0 | 0 | 1 | 1 | 0 | 0 | 0 | 1 | 1 | 0 | 0 | 1 | 1 | 0 | 0 | 1 |
| $t_{15}$ | 1 | 1 | 0 | 0 | 1 | 1 | 0 | 0 | 1 | 1 | 1 | 0 | 0 | 1 | 1 | 0 | 0 | 1 | 1 |
| $t_{16}$ | 1 | 0 | 0 | 1 | 1 | 0 | 0 | 1 | 1 | 1 | 0 | 0 | 1 | 1 | 0 | 0 | 1 | 1 | 0 |
| $t_{17}$ | 1 | 0 | 1 | 1 | 0 | 0 | 1 | 1 | 0 | 0 | 0 | 1 | 1 | 0 | 0 | 1 | 1 | 0 | 0 |
| $t_{18}$ | 1 | 0 | 1 | 0 | 0 | 1 | 1 | 0 | 0 | 0 | 1 | 1 | 0 | 0 | 1 | 1 | 0 | 0 | 1 |
| $t_{19}$ | 1 | 0 | 1 | 0 | 1 | 1 | 0 | 0 | 1 | 1 | 1 | 0 | 0 | 1 | 1 | 0 | 0 | 1 | 1 |
| $t_{20}$ | 1 | 0 | 1 | 0 | 1 | 0 | 0 | 1 | 1 | 1 | 0 | 0 | 1 | 1 | 0 | 0 | 1 | 1 | 0 |
| $t_{21}$ | 1 | 0 | 1 | 0 | 1 | 0 | 1 | 1 | 0 | 0 | 0 | 1 | 1 | 0 | 0 | 1 | 1 | 0 | 1 |
| $t_{22}$ | 1 | 0 | 1 | 0 | 1 | 0 | 1 | 0 | 0 | 0 | 1 | 1 | 0 | 0 | 1 | 1 | 0 | 0 | 1 |
| $t_{23}$ | 1 | 0 | 1 | 0 | 1 | 0 | 1 | 0 | 1 | 0 | 0 | 1 | 1 | 0 | 0 | 1 | 0 | 1 | 0 |
| $t_{24}$ | 1 | 0 | 1 | 0 | 1 | 0 | 1 | 0 | 1 | 0 | 1 | 1 | 0 | 0 | 1 | 1 | 0 | 1 | 0 |
| $t_{25}$ | 1 | 0 | 1 | 0 | 1 | 0 | 1 | 0 | 1 | 0 | 1 | 0 | 0 | 1 | 1 | 0 | 1 | 0 | 1 |
| $t_{26}$ | 1 | 0 | 1 | 0 | 1 | 0 | 1 | 0 | 1 | 0 | 1 | 0 | 1 | 1 | 0 | 0 | 1 | 0 | 1 |
| $t_{27}$ | 1 | 0 | 1 | 0 | 1 | 0 | 1 | 0 | 1 | 0 | 1 | 0 | 1 | 0 | 0 | 1 | 1 | 0 | 1 |
| $t_{28}$ | 1 | 0 | 1 | 0 | 1 | 0 | 1 | 0 | 1 | 0 | 1 | 0 | 1 | 0 | 1 | 1 | 0 | 1 | 0 |
| $t_{29}$ | 1 | 0 | 1 | 0 | 1 | 0 | 1 | 0 | 1 | 0 | 1 | 0 | 1 | 0 | 1 | 0 | 0 | 0 | 0 |
| $t_{30}$ | 1 | 0 | 1 | 0 | 1 | 0 | 1 | 0 | 1 | 0 | 1 | 0 | 1 | 0 | 1 | 0 | 1 | 0 | 1 |

TABLE 2

| | ST | $A_s$ | $B_s$ | $C_s$ | $D_s$ | $E_s$ | $F_s$ | $G_s$ | H | IM | $A_i$ | $B_i$ | $C_i$ | $C_i$ | $E_i$ | $F_i$ | $G_i$ | $H_i$ | $I_i$ |
|---|---|---|---|---|---|---|---|---|---|---|---|---|---|---|---|---|---|---|---|
| $t_1$ | 1 | 1 | 0 | 0 | 1 | 1 | 0 | 0 | 1 | 0 | 1 | 0 | 1 | 0 | 1 | 0 | 1 | 0 | 1 |
| $t_2$ | 1 | 0 | 0 | 1 | 1 | 0 | 0 | 1 | 1 | 0 | 1 | 0 | 1 | 0 | 1 | 0 | 1 | 0 | 1 |
| $t_3$ | 0 | 0 | 1 | 1 | 0 | 0 | 1 | 1 | 0 | 0 | 1 | 0 | 1 | 0 | 1 | 0 | 1 | 0 | 1 |
| $t_4$ | 0 | 1 | 1 | 0 | 0 | 1 | 1 | 0 | 0 | 0 | 1 | 0 | 1 | 0 | 1 | 0 | 1 | 0 | 1 |
| $t_5$ | 1 | 1 | 0 | 0 | 1 | 1 | 0 | 0 | 1 | 1 | 1 | 0 | 1 | 0 | 1 | 0 | 1 | 0 | 1 |
| $t_6$ | 1 | 0 | 0 | 1 | 1 | 0 | 0 | 1 | 1 | 1 | 0 | 0 | 1 | 0 | 1 | 0 | 1 | 0 | 1 |
| $t_7$ | 0 | 0 | 1 | 1 | 0 | 0 | 1 | 1 | 0 | 0 | 0 | 1 | 1 | 0 | 1 | 0 | 1 | 0 | 1 |
| $t_8$ | 0 | 1 | 1 | 0 | 0 | 1 | 1 | 0 | 0 | 0 | 1 | 1 | 0 | 0 | 1 | 0 | 1 | 0 | 1 |
| $t_9$ | 1 | 1 | 0 | 0 | 1 | 1 | 0 | 0 | 1 | 1 | 1 | 0 | 0 | 1 | 1 | 0 | 1 | 0 | 1 |
| $t_{10}$ | 1 | 0 | 0 | 1 | 1 | 0 | 0 | 1 | 1 | 1 | 0 | 0 | 1 | 1 | 0 | 0 | 1 | 0 | 1 |
| $t_{11}$ | 0 | 0 | 1 | 1 | 0 | 0 | 1 | 1 | 0 | 0 | 0 | 1 | 1 | 0 | 0 | 1 | 1 | 0 | 1 |
| $t_{12}$ | 0 | 1 | 1 | 0 | 0 | 1 | 1 | 0 | 0 | 0 | 1 | 1 | 0 | 0 | 1 | 1 | 0 | 0 | 1 |
| $t_{13}$ | 1 | 1 | 0 | 0 | 1 | 1 | 0 | 0 | 1 | 1 | 1 | 0 | 0 | 1 | 1 | 0 | 0 | 1 | 1 |
| $t_{14}$ | 1 | 0 | 0 | 1 | 1 | 0 | 0 | 1 | 1 | 1 | 0 | 0 | 1 | 1 | 0 | 0 | 1 | 1 | 0 |
| $t_{15}$ | 1 | 0 | 1 | 1 | 0 | 0 | 1 | 1 | 0 | 0 | 0 | 1 | 1 | 0 | 0 | 1 | 1 | 0 | 1 |
| $t_{16}$ | 1 | 0 | 1 | 0 | 0 | 1 | 1 | 0 | 0 | 0 | 1 | 1 | 0 | 0 | 1 | 1 | 0 | 0 | 1 |
| $t_{17}$ | 1 | 0 | 1 | 0 | 1 | 1 | 0 | 0 | 1 | 1 | 0 | 0 | 1 | 1 | 0 | 0 | 1 | 1 | 1 |
| $t_{18}$ | 1 | 0 | 1 | 0 | 1 | 0 | 0 | 1 | 1 | 1 | 0 | 0 | 1 | 1 | 0 | 0 | 1 | 1 | 0 |
| $t_{19}$ | 1 | 0 | 1 | 0 | 1 | 0 | 1 | 1 | 0 | 0 | 0 | 1 | 1 | 0 | 0 | 1 | 1 | 0 | 0 |
| $t_{20}$ | 1 | 0 | 1 | 0 | 1 | 0 | 1 | 0 | 0 | 0 | 1 | 1 | 0 | 0 | 1 | 1 | 0 | 0 | 1 |
| $t_{21}$ | 1 | 0 | 1 | 0 | 1 | 0 | 1 | 0 | 1 | 1 | 0 | 0 | 1 | 1 | 0 | 0 | 1 | 1 | 1 |
| $t_{22}$ | 1 | 0 | 1 | 0 | 1 | 0 | 1 | 0 | 1 | 1 | 0 | 0 | 1 | 1 | 0 | 0 | 1 | 1 | 0 |
| $t_{23}$ | 1 | 0 | 1 | 0 | 1 | 0 | 1 | 0 | 1 | 0 | 1 | 1 | 0 | 0 | 1 | 1 | 0 | 0 | 0 |
| $t_{24}$ | 1 | 0 | 1 | 0 | 1 | 0 | 1 | 0 | 1 | 0 | 1 | 0 | 0 | 1 | 1 | 0 | 0 | 0 | 1 |
| $t_{25}$ | 1 | 0 | 1 | 0 | 1 | 0 | 1 | 0 | 1 | 0 | 1 | 0 | 1 | 1 | 0 | 0 | 1 | 1 | 1 |
| $t_{26}$ | 1 | 0 | 1 | 0 | 1 | 0 | 1 | 0 | 1 | 0 | 1 | 0 | 1 | 0 | 0 | 1 | 1 | 1 | 0 |
| $t_{27}$ | 1 | 0 | 1 | 0 | 1 | 0 | 1 | 0 | 1 | 0 | 1 | 0 | 1 | 0 | 1 | 1 | 0 | 0 | 0 |
| $t_{28}$ | 1 | 0 | 1 | 0 | 1 | 0 | 1 | 0 | 1 | 0 | 1 | 0 | 1 | 0 | 1 | 0 | 0 | 0 | 1 |
| $t_{29}$ | 1 | 0 | 1 | 0 | 1 | 0 | 1 | 0 | 1 | 0 | 1 | 0 | 1 | 0 | 1 | 0 | 1 | 1 | 1 |
| $t_{30}$ | 1 | 0 | 1 | 0 | 1 | 0 | 1 | 0 | 1 | 0 | 1 | 0 | 1 | 0 | 1 | 0 | 1 | 1 | 0 |

The first effective line is consequently located below $A_i$ or $B_i$, depending upon the field. Moreover, the additional electrode is arranged at the other edge of the A section in order to ensure that the geometric conditions for the last line, i.e. the line below the electrode $H_i$, are as equal as possible to the conditions for the remaining preceding lines.

In the vertical direction, the states of the arrangement at a number of successive instants are plotted. The symbol "1" corresponds to a high voltage at which a potential well is induced in the channel 2 below the relevant electrode. The symbo. "0" corresponds to a low voltage at which a potential barrier is induced in the channel 2.

It is assumed in the Tables that the storage section or B section has shifted the information of a preceding frame via the horizontal register C to the outside in the 4-phase manner described above (with extracted accordion) and that the end of the integration period is indicated by an external pulse. In principle, the information stored in the sensor section or A section can now be shifted on to the storage section. However, it is then necessary that the storage section operated in a 4-phase manner is tuned to the sensor section.

As described above, this section is operated in the accordion mode (2-phase manner), a charge packet being stored below every other electrode. According to Table 1, charge is stored below the clock electrode IM, $B_i$, $D_i$, $F_i$ and $H_i$. In the field according to Table 2, charge is stored below the clock electrodes $A_i$, $C_i$, $E_i$, $G_i$.

The sensor section cannot participate in the transport until the logic state of IM matches the logic state of the last three electrodes of the storage section in such a manner that these last three electrodes together with IM can be considered as one stage of a 4-phase CCD. In Table 1, in which during the integration period IM was $=1$, this situation arises when the states of the electrodes $E_s$, $F_s$ and $G_s$ are equal to 0, 0 and 1, respectively. This situation occurs at the instant $t_4$ in Table 1.

In the field according to Table 2, in which during the integration period IM$=0$, the said situation occurs when the electrodes $E_s$, $F_s$ and $G_s$ have the logic states 1, 1 and 0 respectively, likewise at the instant $t_4$. From $t_4$, IM may change for the first time and IM effectively becomes equal to a stage of the storage section. As will appear below, the state of IM becomes equal to that of H.

The charge packets present in the field of Table 2 below IM are now shifted into the storage section by means of the usual 4-phase transport. Since, as already stated above, no complete image line is built up below IM, this line is directly drained via the horizontal C register when it has arrived below $I_s$.

The first complete image line was stored in the field below $B_i$ in Table 1. Therefore, the storage section continues to clock until the image line integrated in the integration period below $B_i$ has arrived below ST. ($t_{15}$, Table 1). In Table 1, the course of this line is indicated by the broken line.

In the field according to Table 2, the storage section continues to operate until the first image line formed below $A_i$ has arrived below ST ($t_{13}$ in Table 2). When an (effective) image line has been stored below ST, ST is no longer allowed to change its logic state. This instant occurs when ST$=1$, but after also the last electrode $I_i$ of the photosensitive section has changed its state. At this instant, in fact all lines of charge packets participate in the 4-phase transport and then cover the whole photosensitive section and the storage section. The accordion is fully extracted at that instant and can be compressed again from the electrode ST.

The instant at which the storage section of the accordion has been fully compressed can be detected again by considering, for example, the clock electrodes $G_s$ and $E_s$. If these electrodes have the same logic state, the storage accordion is compressed. In Table 1, this is the case at the instant $t_{22}$, while in Table 2 this is the case at $t_{21}$.

When the storage accordion is compressed, IM is also applied to a fixed potential, after which the accordion of the image section is compressed. Depending upon the frame (even or odd), the logic state of IM becomes equal to 0 or 1. When this has taken place, the accordion of the photosensitive section or the A section is also compressed. The instant at which this accordion (or this part of the accordion) is compressed completely can also be detected, i.e. in that it is ascertained when, for example, the electrodes $G_i$ and $I_i$ of the photosensitive section have the same states.

It should be noted that, when the last accordion is compressed (and therefore the photosensitive section is ready to trap again an image and to convert it into a charge pattern), the image line which in the diagram of Table 2 is integrated below $I_i$ and does not contain usable information because of asymmetry effects is now stored below IM.

When the whole frame has been stored in the storage section, the information can be read linewise in the usual manner by means of the C register.

The synchronization as described here can be realized for the major part in the system itself, independently of the frame (even or odd). The only external pulses (or pulses which are generated at least outside the represented part of the arrangement) which are required, are:

(1) the pulse indicating that the integration period has ended (designated hereinafter as VTE pulse$=$vertical transport enable);

(2) the pulse indicating whether the field is even or odd and designated hereinafter as FI ($=$Field Identifier pulse).

Figure 7:
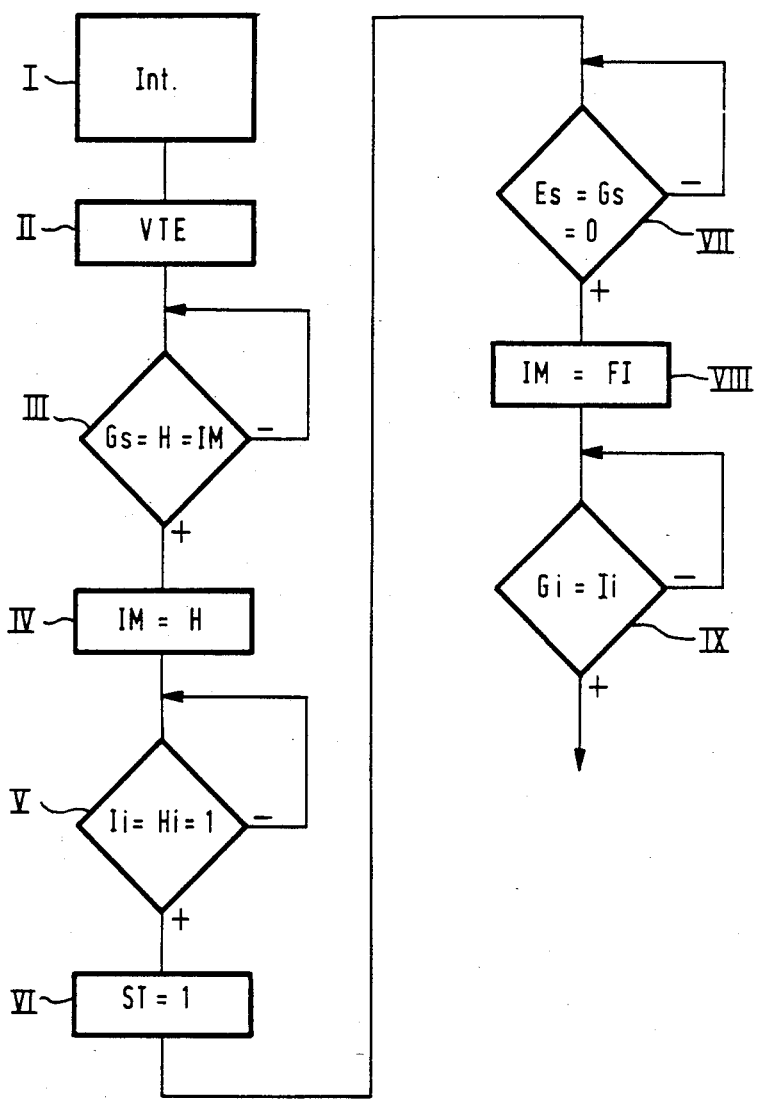
FIG. 7 shows the current diagram of the mode of operation of an accordion sensor according to the invention.

FIG. 7 shows a flow diagram of the control of the arrangement as described above.

Step I

For 20 msec ($20.10^{-3}$ sec.), an image is sensed in the A section and converted into a pattern of change packets.

Step II

By an external circuit by means of a Sync-I.C., the end of the integration is indicated by means of the VTE pulse.

Step III

The displacement of the charge pattern to the storage section cannot begin until the storage section and the photosensitive section are tuned to each other. For the system with 4-phase transport described here, this is the case if $F_s'=G_s=$IM, where $F_s'$ is the inverse state of $F_s$.

In the present embodiment, a further line is added in the shift register 8 of the storage section after the last electrode $G_s$, but this line is no longer coupled to a clock electrode of the storage section. Thus, the condition indicated above can also be expressed by the formula: $G_s=H=$IM. As long as this condition is not satisfied, transport out of the image section is delayed.

Step IV

As soon as the aforementioned condition is indeed satisfied, IM is allowed to change its logic state. However, this must not be effected in an uncontrolled manner, but it must take place in phase with the 4-phase clocks in the storage section. In order to achieve this, IM is coupled to H and thus becomes effectively equal to the next CCD stage after $G_s$.

Step V

IM now remains equal to H, while ST also continues to change until the first (effective) charge has arrived below ST. This situation can be detected as follows (see also Tables 1, 2).

(a) Has the last stage $I_i$ of the photosensitive section changes its state? If therefore the preceding state of $I_i$ is written as $I_i(n)$, it has to be ascertained whether $I_i(n)\neq I_i(n+1)$.

(b) If this condition is satisfied, let ST change until ST$=1$, whereupon the state of ST no longer changes. As appears from Tables 1 and 2, the conditions can be expressed by the equation $I_i=H_i=1$ ($t_{15}$ in Table 1, $t_{13}$ in Table 2).

Step VI

If the condition V is satisfied, ST remains=1. The storage accordion is then compressed. However, for IM it continuously holds that IM=H.

Step VII

In the following stage of the current diagram, the instant is detected at which the storage accordion is completely compressed. This is the case if the electrodes $E_s$ and $G_s$ have the same state. With the given number of clock electrodes, this remains that the instant is determined at which it holds that: $E_s=G_s=0$ ($t_{22}$, Table 1; $t_{20}$, Table 2).

Step VIII

If the aforementioned condition is satisfied, the accordion of the photosensitive section can also be compressed by setting IM to a fixed condition. This condition is frame-dependent and equal to 1 for one frame and equal to zero for the other frame. This is indicated in FIG. 7 by the equation IM=FI. The FI pulse is again a pulse produced outside, i.e. generated outside the sensor chip or on the sensor chip, but outside the represented part of the circuit.

Step IX

The new integration period begins when the accordion of the photosensitive section is completely compressed. This situation can be detected by ascertaining whether the conidition $G_i=I_i$ is satisfied. If this condition is satisfied, if desired, a next operation may be carried out, such as, for example, the transfer of a line from the storage section to the horizontal register C.

Figure 8:
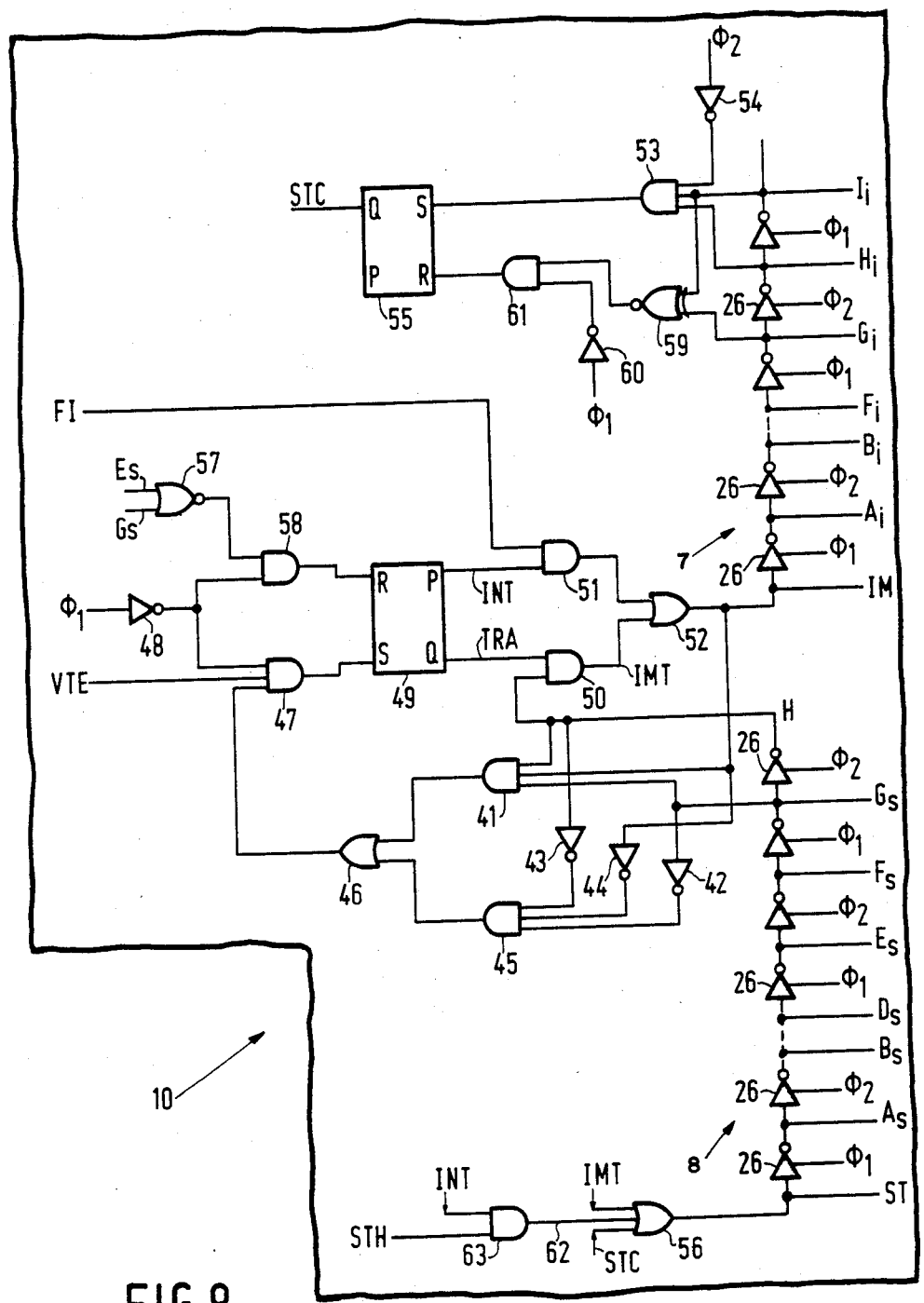
FIG. 8 shows the circuit diagram of an arrangement according to the invention.

FIG. 8 shows an implementation of the flow diagram shown in FIG. 7. In FIG. 8, the shift registers 7 and 8 and the associated clock electrodes ST, $A_s$, $B_s$ ... $G_s$, IM, $A_i$, $B_i$ ... $I_i$ are shown. For the sake of clarity, only the inverter circuits 26 and the associated clock voltages $\phi$ of the shift registers 7, 8 are shown. The switches 31 (see FIG. 3) are omitted in FIG. 8. For the description of the circuit of FIG. 8, the order of succession of the flow diagram shown in FIG. 7 is maintained. It should be noted that the last inverter circuit 26 of the shift register 7 drives not a clock electrode of the storage section, but the point H which is used, as will appear, for driving IM.

I, II. When the integration period has ended, the signal VTE is supplied from the outside, as a result of which it becomes possible to transfer the stored information from the photosensitive section to the storage section.

III. For the transfer, as explained hereinbefore, the condition $G_s=H=IM$ has to be satisfied. A first possible solution for this equation is $G_s=H=IM=1$. In order to ascertain whether this condition is satisfied, the states $G_s$, H and IM are supplied to a logic AND gate 41, which produces a "1" at the output if $G_s=H=IM=1$ and a "0" in all other combinations.

The second solution for the equation $G_s=H=IM$ consists in that all these parameters are equal to 0. In order to ascertain this, the signals are first inverted by means of the inverter circuits 42, 43 and 44 and are then supplied in the inverted state to the AND gate 45. This gate produces at its output a 1 only if $G_s=H=IM=0$.

The output signals of the AND gates 41 and 45 are supplied to the inputs of the OR gate 46, which produces as output signal a 1, if either the output of 41 or the output of 45 produces a 1.

The output signal of the OR gate 46 is supplied to the input of the AND gate 47. The signal VTE is supplied to the second input of the AND gate 47. As appears from FIG. 8, the AND gate 47 comprises a third input which is connected to the output of an inverter circuit 48, to whose input the clock signal $\phi_1$ is supplied. Although it is not absolutely necessary that the inverted $\phi_1$ signal is supplied to the AND gate 47, this nevertheless has certain advantages because the first stage of the shift register 7 is also driven by $\phi_1$. When $\phi_1$ is supplied in the inverted state to the AND gate 47, it is achieved that, when IM varies, the first MOS switch of the shift register 7 is non-conducting.

The AND gate 47 therefore produces at its output a 1 only if $\phi_1$ is low. If this condition is satisfied and moreover $G_s=H=IM$, the AND gate produces a 1 signal which is supplied to the S input of the RS flipflop 49.

The flipflop 49 has two outputs, P and Q, which are always equal to the inverse of each other ($P=\bar{Q}$). It further holds that, when a signal appears at S (set), Q becomes equal to 1 and that the flipflop can be reset by a signal pulse at the input R (reset).

When a 1 appears at the output of the AND gate 47, which is supplied to the S input of the flipflop 49, the output Q of the flipflop 49 assumes the level 1. This signal is supplied to one of the inputs of the AND gate 50, whose other input is connected to the point H. The p output of the flipflop 49, which has the level 0 if Q has the level 1, is connected to an input of the AND gate 51. The outputs of the AND gates 50 and 51 are connected to the inputs of the OR gate 52. In the situation given, in which the output of the AND gate 51=0 because the output P of the flipflop 49=0, the OR gate 52 follows entirely the AND gate 50 and—especially because the output Q of the flipflop 49=1, the level of the point H. This situation corresponds to the condition IV in the flow diagram of FIG. 7: IM=H.

The output signal of the AND gate 50 is designated by IMT (=Input Image Transport) and in the situation given is=H. The signal IMT not only controls the clock electrode, but is also supplied to the clock electrode ST via the OR gate 56. The two other inputs of the OR gate 56, which will be referred to hereinafter, are equal to 0 so that in this period it holds that: ST=H. The signal IMT can simply be supplied via a conductive connection to the OR gate 56. For the sake of clarity of the drawing, this connection is omitted and is replaced by an arrow IMT at the OR gate 56.

It should be noted that the condition of the flipflop 49 does not change any more when $\phi_1$ is clocked.

The next condition that has to be detected (step V in the flow diagram of FIG. 7) is meant to ascertain whether the last clock electrodes of the photosensitive section also participate in the charge transport: $I_i=H_i=1$. This condition can be detected by means of the AND gate 53, of which two inputs are connected to the clock electrodes $I_i$ and $H_i$. A third input of the AND gate 53 is connected to the output of an inverter circuit 54, to whose input the clock signal $\phi_2$ is supplied. The inverter 54 may be omitted, but has the same advantage as the inverter 48, i.e. that the situation does not change when $\phi_2=1$.

The output signal of the AND gate 53 is supplied to the S input of the RS flipflop 55. If the AND gate produces an output signal=1, which means that $I_i=H_i=1$, the Q output of the flipflop 55 produces an output signal=1. The output signal at the Q output is designated for the sake of simplicity by STC (storage close) and is supplied via one of the inputs of the OR gate 56 to the clock electrode ST. Due to the fact that STC=1, the output of the OR gate now also becomes equal to 1. From this instant ST does not change any more (condition VI in the current diagram of FIG. 7) and the storage accordion is compressed.

It should be noted that the signal STC can again be supplied to the OR gate 56 via a usual connection, which, however, is not shown in FIG. 8 for the sake of clarity.

The next condition that has to be detected is the condition VII in the current diagram of FIG. 7, i.e. the condition $E_s = G_s$.

Since the storage accordion is compressed always in the same field-independent manner, this comparison can also be written, in view of the number of electrodes, as $E_s = F_s = 0$. In order to detect this condition, the potentials of the electrodes $E_s$ and $G_s$ are applied to the inputs of the NOR gate 57 (the connections between the electrodes and the gate 57 are replaced for the sake of clarity by the symbols $E_s$ and $G_s$). The NOR gate 57 only produces a 1 at the output if the two input signals are =0.

The output signal of the NOR gate 57 may be supplied, if desired, directly to the R input of the flipflop 49. However, the output signal of the gate 57 is preferably supplied together with the $\phi_1$ signal inverted by the inverter circuit 48 via the AND gate 58 to the flipflop 49.

When $E_s = G_s = 0$, a signal=1 is generated by the AND gate 58 in a time interval in which $\phi_1 = 0$. This signal is supplied to the R input (reset input) of the flipflop 49. The flipflop 39 is reset, which means that P becomes =1 and Q becomes =0. Due to the fact that Q becomes=0, the AND gate 50 no longer transmits the signals H to the clock electrode IM. The latter can now also be applied to a fixed potential in order to also compress the photosensitive accordion.

The condition to which IM and hence also the whole photosensitive accordion is set is field-dependent, however. For this purpose, a signal FI (field identification) is supplied from outside, which may be a 0 or a 1, dependent upon the field, and which is supplied to IM via the AND gate 51 and the OR gate 52 (condition VIII in the flow diagram of FIG. 7). With FI=0, the output signal of the AND gate 51=0 so that, because the output signal IMT of the AND gate 50=0, this also holds for the output signal of the OR gate 52. If on the contrary FI=1, the output signal of the OR gate 52 will also be equal to 1.

The accordion of the photosensitive section is then compressed. According to the flow diagram of FIG. 7, the next condition to be detected is expressed by the equation IX: $G_i = I_i$, which is indicative of whether the photosensitive accordion is completely compressed. The solution is field-dependent, that is to say that $G_i$ and $I_i$ can both be simultaneously either 0 or 1. For this purpose, the potentials of $G_i$ and $I_i$ are compared with each other by the exclusive NOR gate 59. This gate produces an output signal 1 if the input signals are equal to each other and produces a 0 if the input signal are not equal to each other.

The output of the gate 59 could be directly connected to the R input of the flipflop 55. In the present embodiment, the flipflop 55 is changed only if $\phi_1 = 0$. The clock signal $\phi_1$ is supplied for this purpose to the inverter circuit 60, whose output is connected to an input of the AND gate 61.

If $I_i = G_i$ and $\phi_1 = 0$, the AND gate produces an output signal=1 at the R input of the flipflop 55. The Q output then passes again to 0. The signal STC also passes to "0" (and passes only back to "1" when upon displacement of the next field the accordion is completely extracted or when $H_i = I_i$). The photosensitive accordion is now completely compressed, which means that the photosensitive section of the sensor is ready to form a new field of image information. Meanwhile, the information stored in the storage section can be read linewise.

For this purpose, the OR gate 56, whose inputs STC and IMT are both at "0", is provided with a third input 62, via which the externally generated signal STH (input storage hustling) is supplied to the clock electrode ST and which renders it possible for an image line stored below the clock electrode ST to be transferred to the horizontal C register. In order to ensure that the signal STH is only transmitted when the storage accordion is compressed, the signal STH is compared with the output signal at the P output of the flipflop 49, designated by INT at the AND gate 63, whose output is connected to the input 62 of the OR gate 56. If INT=1, ST follows the signal STH.

During the transfer of the charge to the C register, the lines stored in the storage section are transported downward. This transport can take place again in the same manner, though at a lower frequency, as the transport described above, an increasingly larger part of the storage accordion participating in the 4-phase transport. When the whole frame has been read, the signal VTE can be supplied again, while (via the same input as that via which the signal STH is supplied) a clock signal is supplied having a comparatively high frequency, whereupon the cycle described here starts again.

The gates and flipflops present in the circuit shown in FIG. 8 may all be of a generally known configuration. The circuit may be entirely manufactured in C-MOS technology according to FIG. 2 and may be integrated together with the sensor and the shift registers 7 and 8 in one common semiconductor body 10.

It will be appreciated that the invention is not limited to the embodiment described here, but that many further modifications are possible for those skilled in the art without departing from the scope of the invention. The invention may also be used, for example, in 2-phase charge-coupled devices, in which during the charge transport, when the accordion is (is being) extracted, a charge packet is present in every second electrode, while during the storage, when the accordion is (is being) compressed, charge can be stored below each electrode. For such a mode of operation, it is known that each electrode may be in the form of a storage section and a transfer section, while, when a common voltage is applied, a potential well is induced below the storage section and a potential barrier is induced below the transfer section in the charge transport channel.

The invention may further be used, besides in the type of sensors described here, in other charge-coupled devices with the accordion mode of operation. Alternatively, instead of being directly biased by the shift registers 7, 8 the clock electrodes may be connected to switches which connect the electrodes either to a point at a fixed voltage or to a point at a varying voltage, as described, for example, in Netherlands Patent Application No. 8301977 (PHN 10 698) in the name of the Applicant. The invention may also be used in sensors of the interline type or line sensors, which are operated according to the accordion principle described here.

What is claimed is:

1. A charge-coupled device comprising:
   a. a semiconductor body having a charge transport channel defined at the surface for storing and stepwise transferring information in the form of discrete charge packets;
   b. a row of clock electrodes above the charge transport channel for inducing a pattern of alternate potential wells and potential barriers in the charge transport channels;
   c. first means for applying voltages to the clock electrodes, these means being such that during the storage of charge packets the charge-coupled device is operated as an m-phase device and during the transfer of charge packets is operated as an n-phase device, m and n both being natural numbers and m being larger than or equal to 1 and n being larger than m,
   characterized in that second means are provided, by which the condition of the charge-coupled device can be detected and, depending upon this condition, an adjustment signal can be generated, which is used as a control signal for causing the charge-coupled device to pass to a next condition.

2. A charge-coupled device as claimed in claim 1, characterized in that the arrangement is an image sensor arrangement of the frame transfer type comprising a plurality of adjacent parallel charge-coupled devices, which are provided with a common system of clock electrodes, a first part of the charge-coupled devices being suitable for use as a photosensitive section for collecting incident radiation and converting it into a pattern of charge packets and a second part of the charge-coupled devices being suitable for use as a storage section for temporarily storing these charge packets formed in the first part for line-by-line reading via a horizontal reading register, in which the charge stored in the storage section can be line-by-line transferred, while the system of clock electrodes comprises two groups, a first group which forms part of the storage section and comprises a number of clock electrodes—designated hereinafter by ST, $A_s$, $B_s$ ... $G_s$, ST and $G_s$ being located closest to the horizontal reading register and closest to the photosensitive section, respectively, and a second group of clock electrodes which forms part of the photo-sensitive section and which comprises a number of clock electrodes, designated hereinafter by IM, $A_i$, $B_i$, $C_i$ ... $I_i$, IM and $I_i$ being located closest to and remotest from the storage section.

3. A charge-coupled device as claimed in claim 2, characterized in that the said first means for applying clock voltages to the electrodes comprise a first and a second shift register, the storage section being associated with the first shift register, by means of which a fixed voltage and alternating voltages can be applied to the clock electrodes of a varying part of the storage section, the photosensitive section being associated with the second shift register, by means of which a fixed voltage and alternating voltages can be applied to the clock electrodes of a varying part of the photosensitive section.

4. A charge-coupled device as claimed in claim 2 or 3, characterized in that the said second means comprise a circuit, by means of which at the beginning of the charge transport of charge packets from the photosensitive section to the storage section it can be detected whether the storage section and the first clock electrode IM are tuned to each other on behalf of n-phase charge transport, while this circuit, if this is the case, generates a signal, designated as transport signal, as a result of which the voltage at the clock electrode IM changes its value.

5. A charge-coupled device as claimed in claim 4, characterized in that the last clock electrode $G_s$ of the storage section is driven by the last stage but one of the first shift register and in that switching means are provided, by means of which the first electrode IM of the photosensitive section is temporarily coupled to the output of the last stage of the first shift register when the said transport signal is generated by the second means.

6. A charge-coupled device as claimed in claim 5, characterized in that the said second means comprise a detection circuit, by which it can be detected whether the voltage at the last clock electrode $I_i$ of the photosensitive section has changed during the transport of the charge packets from the photosensitive section to the storage section and, if this is the case by what means a signal can be generated, as a result of which a fixed voltage is applied to the first clock electrode ST of the storage section during the remainder of the said charge transport, while charge can be stored below this clock electrode.

7. A charge-coupled device as claimed in claim 6, characterized in that the said second means moreover comprise a circuit by means of which it can be detected whether/when, after the said fixed voltage has been applied to the first electrode ST of the storage section, the whole storage section, inclusive of the last electrode $G_s$ of the storage section, is operated as an m-phase charge-coupled device, the voltages at the electrodes varying no longer.

8. A charge-coupled device as claimed in claim 7, characterized in that the said circuit comprises means by which, when the whole storage section is operated as an m-phase device, a signal is generated, as a result of which a fixed voltage is also applied to the clock electrode IM of the photosensitive section, so that a gradually increasing part of the photosensitive section of the electrode IM is operated as an m-phase device, a fixed voltage being applied to these clock electrodes.

9. A charge-coupled device as claimed in claim 8, characterized in that the said circuit further comprises means by which the fixed voltage applied to IM is adjustable to a comparatively high level and to a comparatively low level.

10. A charge-coupled device as claimed in claim 9, characterized in that said second means further comprise a detection circuit by means of which it can be detected whether/when, after IM has been applied to a fixed voltage, the potential of the last electrode $I_i$ of the photosensitive section does not change any more either.

11. A charge-coupled device as claimed in claim 10, characterized in that the said detection circuit further comprises means by which, when the last electrode $I_i$ of the photosensitive section does not change its potential any more, a signal can be generated, as a result of which the charge packets stored below the electrode ST of the storage section can be transferred to the horizontal reading register.

12. A charge-coupled device as claimed in claim 11, characterized in that the said second means are provided together with the charge-coupled image sensor arrangement in a common semiconductor body.

13. A camera provided with an image sensor device as claimed in claims 1, 2, or 3.

14. A charge coupled device comprising:
- a semiconductor body having a charge transport channel for storing and transporting information in the form of discrete charge packets;
- a plurality of clock electrodes arranged in a row above the charge transport channel for producing a pattern of potential wells and potential barriers in the charge transport channel;
- voltage supply means connected to the clock electrodes, said voltage supply means providing a set of clock voltages to the clock electrodes, each clock voltage having a value equal to at least a first or a second logic value, said voltage supply means providing a time sequence of clock voltage sets, each set of clock voltages being a device state; and
- control means for detecting the present device state and for determining the next device state.

15. A charge coupled device as claimed in claim 14, characterized in that the control means detects the logic value of at least one clock voltage.

* * * * *